United States Patent
Greelish

(10) Patent No.: US 7,400,142 B2
(45) Date of Patent: Jul. 15, 2008

(54) DYNAMIC MAGNETIC ANOMALY COMPENSATION

(76) Inventor: Stephen John Greelish, 130 Pond Cir., Mashpee, MA (US) 02649

( * ) Notice: Subject to any disclaimer, the term of this patent is extended or adjusted under 35 U.S.C. 154(b) by 185 days.

(21) Appl. No.: 10/981,840

(22) Filed: Nov. 5, 2004

(65) Prior Publication Data

US 2005/0099177 A1 May 12, 2005

Related U.S. Application Data

(60) Provisional application No. 60/518,158, filed on Nov. 6, 2003.

(51) Int. Cl.
*G01R 35/00* (2006.01)
*G01R 33/02* (2006.01)
*G01C 25/00* (2006.01)
*G01S 3/80* (2006.01)

(52) U.S. Cl. .................. 324/247; 324/202; 33/356; 73/1.77; 73/1.78; 367/125; 367/131

(58) Field of Classification Search ............. 324/244, 324/247, 249, 253, 202; 33/356; 73/1.77, 73/1.78; 367/125, 131
See application file for complete search history.

(56) References Cited

U.S. PATENT DOCUMENTS

| | | | | |
|---|---|---|---|---|
| 3,942,257 A | * | 3/1976 | Erspamer | 33/361 |
| 5,682,335 A | * | 10/1997 | Assous et al. | 702/105 |
| 6,476,610 B1 | * | 11/2002 | Wiegert et al. | 324/345 |
| 6,543,146 B2 | * | 4/2003 | Smith et al. | 33/356 |

* cited by examiner

*Primary Examiner*—Edward Lefkowitz
*Assistant Examiner*—David M. Schindler
(74) *Attorney, Agent, or Firm*—Robert K. Tendler

(57) ABSTRACT

An array of three-axis magnetometers used for dynamic magnetic anomaly compensation are located at the corners of a parallelopiped, with pairs of magnetometer outputs used to derive a magnetic anomaly gradient vector used to compensate a compass and/or the output of a gyroscope in an inertial management unit. The system may be used in a neutrally buoyant remotely operated vehicle to permit ascertaining of course and position in the absence of surface control signals.

17 Claims, 4 Drawing Sheets

DYNAMIC MAGNETIC ANOMALY COMPENSATION

RELATED APPLICATIONS

This application claims rights under 35 USC § 119(e) from U.S. Provisional Application Ser. No. 60/518,158 filed Nov. 6, 2003, the contents of which are incorporated herein by reference.

FIELD OF THE INVENTION

This invention relates to magnetic anomaly detection systems and more particularly to a system for using detected magnetic anomaly gradients to compensate either electronic compasses or gyroscopes for near field anomalies due to the presence of ferromagnetic objects and fluctuating magnetic fields.

BACKGROUND OF THE INVENTION

As described in U.S. patent application Ser. No. 10/935,986 filed Sep. 8, 2004 by Steven Greelish entitled "Method and Apparatus For Performing an Ultrasonic Survey," incorporated herein by reference, a system is disclosed for use in hull surveying in which a network of acoustic elements is placed on the ocean floor and in which the exact position of a fiducial point on the hull is established.

In one embodiment of this system a neutrally buoyant robot performing as a remotely operated vehicle (ROV) is flown about the hull taking hull thickness measurements at very precise positions on the hull. It is a requirement of this system that the system be able to ascertain location with an error of less than one centimeter, which must be maintained continuously so as not to affect the hull thickness measurements. This requires exact positioning of the robot and thus the survey sensor. The precise positioning is made possible through the use of active acoustic ranging units and pingers on the hull that provide an instantaneous update of the position of the hull relative to the network of acoustic ranging apparatus on the ocean floor and thus the position of the robot relative to the hull.

Oftentimes, however, objects in the water interfere with the acoustic signals from the network as, for instance, when divers or other objects block these signals. When signals are blocked, an inertial navigation unit within the remotely operated vehicle takes over and estimates the position of the robot based on course direction and attitude. Course and attitude are derived from the outputs of an electronic compass, rate or laser gyros or other position sensors so that, in the case that acoustic positioning signals are not available, the ROV can estimate for itself its own position with a high degree of accuracy.

While the remotely operated vehicle normally must rely on an interactive acoustic positioning system to navigate, when this positioning system drops out temporarily or becomes otherwise unavailable, the vehicle must be able to continue to be navigated or to navigate autonomously until the positioning system again becomes available. This is typically accomplished through the use of an inertial guidance system consisting of gyros, electronic compasses, accelerometers, or some combination of the above. The internal guidance system computes position knowing the course of the vehicle, its speed and its attitude. While speed can be ascertained using accelerometers and other traditional speed-measuring apparatus, and whereas attitude measurements rely on the earth's gravitational field, course relies on the earth's magnetic field.

The problem of ascertaining accurate position upon acoustic network failure becomes acute due to the presence of ferromagnetic objects such as ship hulls, and fluctuating magnetic fields caused by electric motors. When a remotely operated vehicle is near an object such as a ship's hull or a wall containing steel or other ferromagnetic material, the navigation compass for the remotely operated vehicle has a heading that will be affected by the magnetic field generated by the object or flux concentration of the earth's magnetic field. Fluctuating magnetic fields generated by nearby electric motors such as the ones used by the propulsion system of the remotely operated vehicle itself will also affect the guidance system of the remotely operated vehicle.

Unlike the earth's magnetic field, which is uniform over a small area, fields generated by ferromagnetic objects exhibit a gradient of $1/r^6$ over a small distance, with the field being stronger nearer to the source and weaker the farther away the compass is from the source.

While in the past there have been a great number of static magnetic compensation systems, such as that described in U.S. Pat. No. 6,173,501, compensation of compasses in such static environments is not applicable to dynamically changing situations in which a compass is not at a fixed distance from a ferromagnetic source. This is precisely the case when a robot is flying around a steel hull.

For static compass compensation some sort of mechanical means is used, usually small permanent magnets and/or soft iron blocks located around the compass to correct for known magnetic fields. However, in the situation where either divers or remotely operated vehicles operate near a ship hull, there needs to be a dynamic magnetic anomaly compensation system that can provide heading accuracies unperturbed by the near field magnetic anomalies due to ferromagnetic objects or the aforementioned magnetic fields caused by electric motors.

By way of background, solid-state sensors have been used to detect magnetic fields. These sensors find applications in many major industries due to their relative low cost, small size and low power requirements. These devices have advantages over flux gate, SQUID, or other complicated low field sensing techniques. Solid-state magnetic sensors directly convert the strength of a magnetic field to a voltage or resistance and can be arranged in a small package to provide for detection along multiple axes in a small space. Such devices have been constructed using giant magneto resistance (GMR) materials and are one category of solid-state sensor.

GMR devices exhibit a change in the resistance when exposed to a magnetic field. The change in resistance is dependent on the orientation of the magnetic field relative to the magnetization of the GMR resistor itself. When the applied magnetic field is parallel to the magnetization of the GMR resistor, the resistance is minimum. When the applied magnetic field is antiparallel to the magnetization of the RMR resistor, the resistance is maximum. Such low field magnetic sensing with GMR sensors is described in an article presented at Sensors Expo—Baltimore, May 1999 by Carl H. Smith and Robert W. Schneider of Non-Volatile Electronics, Inc. of Eden Prairie, Minn.

More particularly, in dealing with magnetic bearings underwater, if one is in open water one can rely on the earth's magnetic field to obtain a reasonably reliable course line with the appropriate compensation for magnetic deviation.

However, when one is working in and around hulls and pipelines, the large quantities of steel and ferrous materials modify the magnetic force lines or actually introduce their own force lines, thereby disrupting or causing major errors in magnetic heading.

Such major errors in magnetic heading are exceptionally troublesome when considering a diver module that operates using an underwater compass system. When operating near any steel structure the underwater compass systems become wildly inaccurate. Moreover, being able to compensate for such magnetic heading anomalies is critical in vehicle control systems, especially for underwater surveying.

While, as mentioned above, when one has an acoustic positioning system that handles vehicle position and attitude while in the line of sight to the acoustic network, these networks can be blocked momentarily when, for instance, a diver gets in the way. At this point the vehicle is without its precise positioning control system.

In order to handle these periods of outages, one can attempt to use an inertial management unit or IMU. Traditionally, inertial management units have used multiple sensors fused to make estimates as to the exact location of the vehicle. In order to do so, gyroscopes and especially laser gyros are used in such systems. However, these gyros suffer drift and precession.

Although by mixing magnetic sensors and gyros, be they laser gyros or rate gyros, one is attempting to make better estimations of the actual position of the vehicle, drift and precession quickly degrade heading measurements. One of course can use a magnetic sensor to correct for drift and precession, if one knows how good the magnetic sensor is.

The problem as mentioned above is that when one is working close to a hull, the magnetic sensor is not of much use. As a result, precession becomes cumulative and the vehicle's course as determined by the inertial management unit deteriorates badly over time.

If the magnetic field relative to the compass is static, one can use the above-mentioned mechanical and electrical compensation systems. It is noted that, whether one considers the diver application or a remotely operated vehicle that is flying around a hull, the relative position of the compass and the ship hull vary. This leads to a dynamic situation in which static compensation is inapplicable.

There is therefore a unique need, especially in surveying systems, for the ability to compensate compasses used in inertial navigation systems for magnetic anomalies that vary dynamically depending on the distance of compass to a ferromagnetic object or depending on the closeness and field strength of an electric motor.

SUMMARY OF INVENTION

In order to be able to compensate a compass or an inertial management unit to adjust heading in real time for dynamically changing near field magnetic anomalies due to the presence of ferromagnetic objects and/or fluctuating magnetic fields, an array of GMR sensors or magnetometers are arranged at the corners of a parallelopiped in the form of a cube in which, for each corner, there is an arrangement of such devices with orthogonal patterns to allow magnetic field measurement along three axes, x, y and z.

In one embodiment, GMR sensors are arranged in a parallelopiped configuration in which each GMR sensor has an x-, y- and z-sensing axis and with each axis parallel to the x, y and z sensing axes of all of the other GMR sensors.

With this arrangement, pairs of sensors are combined to derive a magnetic differential such that one can obtain a magnetic anomaly gradient in the three directions. The gradient is obtainable because the distance along each axis between the sensors is known.

Alignment of the sensors to each other is accomplished by a combination of mechanical and software correction. The distance between sensors is known. The data output from the individual sensors consists of the magnetic field strength measured along each axis. This data for every pair of sensors ($x_1$, $x_2$; $y_1$, $y_2$; $z_1$, $z_2$, etc.) is processed through a differential comparator to generate the difference in field strength between the two sensors.

This process is repeated for every combination of two sensors and the result for every pair of sensors is output to a processor that then calculates the strength and direction of the total magnetic field present, excluding the effect of the earth's magnetic field, which exhibits a negligible gradient over a small area. This provides a magnetic anomaly gradient vector.

Note that in one embodiment the output of the processor is delivered either to a standalone compass to adjust its heading output or to correct the heading output of any gyroscopes used by the inertial management unit. For electronic compasses, heading is adjusted by applying a compensation for the magnetic anomaly. For gyros in the inertial management unit, either they are provided with corrected heading from the compass or their heading output is adjusted to cancel out the magnetic field anomaly error. Another way of adjusting heading is to re-cage the gyro based on the sensed magnetic anomaly gradient vector.

In one embodiment, the parallelopiped cubic arrangement is conveniently realized for a neutrally buoyant robot used for in-water hull surveys in which four pontoons and eight struts are aligned along the edges of the cube. The pontoons are roughly equally spaced, forming a cube from which precision measurements can be made.

The eight three-axis magnetometers allow one to measure the magnetic differentials between any of the two pontoons. Typically, the magnetic fields considered are those near field anomalies that show measurable gradients over relatively short distances.

The gradients allow the prediction of the effect of the anomaly and are applied to correct a compass directly. Since one has three pieces of information from each pair of magnetometers, that being the initial magnetic field, the far sensor magnetic field and the difference, one can calculate the gradient of the field that occurs.

The gradient defines the direction of the influence of the anomaly and one can back calculate out the compensated force line.

It is noted that one does not have to calibrate the sensors at the time of deployment because the sensors have been electrically calibrated prior to launching the remotely operated vehicle. Thus, any gradient that appears is due to a magnetic anomaly.

The system in essence operates by measuring the difference between what the gradient would be without a hull or magnetic anomaly and the gradient due to the hull or magnetic anomaly.

It will be appreciated that the magnetic anomaly gradient detection technique requires four magnetometers such that the difference between the readings at, for instance, one magnetometer on one corner is compared to the readings at the distal ends of the parallelopiped in the x, y and z directions. Thus, one needs at least four magnetometers to provide for the magnetic anomaly vector.

Since the subject remotely operated vehicle can assume any one of a number of different attitudes, there will be times when the gradients on the three axes are not computable.

By using eight magnetometers there will never be a case in which the magnetic anomaly cannot be computed in three orthogonal directions. Thus the use of eight magnetometers gives redundancy so that no matter the attitude of the parallelopiped arrangement, there will always be coverage.

Having derived the magnetic anomaly vector, all that is necessary is to project this vector along the heading plane of the compass to provide a heading deviation correction so that the compass reading can be corrected or compensated for in terms of the deviation associated with the near field ferromagnetic material.

Once having compensated the compass in the inertial management unit, one can use the heading determined by this compensated compass to correct the heading from either a rate gyro, which suffers from drift, or from a laser gyro, which suffers from quantization errors.

What is therefore required is to project the detected magnetic vector onto the plane corresponding to the course outputted by either of the gyros and to correct the heading provided by the gyros in accordance with the correction from the compensated compass.

More specifically, with respect to compass corrections, because the vehicle may assume any attitude and one does not know where the north line really lies, one needs to make measurements on all three axes. One then has to determine the differential on at least three axes and this is accomplished by measuring the differential associated with at least three pairs of sensors. As a result, one can subtract the readings from the sensor pairs and produce three differentials of x, y and z relative to the vehicle. When this is done in all three axes relative to the vehicle, the result is the magnitude and direction of the gradient of the anomaly. Once having derived the gradient, one then calculates, based upon knowing what the baseline magnetic field is, where north actually is. Having calculated where north really is, one can then back-correct the compasses by applying the appropriate deviation.

Thus, in one aspect of the subject invention, the purpose of the system is to find out where magnetic north really is and then apply a correction factor, the deviation, in order to correct the individual compass reading for magnetic north. True north if desired is then readily calculatable.

The orientation of the magnetic gradient vector is relative to the parallelopiped and thus to the robot. Changes in the attitude of the robot can be derived from the output of onboard pitch, tilt, and yaw sensors, and from calculations from the 3 axis magnetometers. Thus, a crosscheck is provided between the mechanical and electronic sensors. In other words, after compensation one will know the attitude of the robot and the direction of the robot.

In one embodiment, the correction can be applied to re-cage the gyro to compensate for drift and precession.

In summary, an array of three-axis magnetometers used for dynamic magnetic anomaly compensation are located at the corners of a parallelopiped, with pairs of magnetometer outputs used to derive a magnetic anomaly gradient vector used to compensate a compass and/or the output of a gyroscope in an inertial management unit. The system may be used in a neutrally buoyant remotely operated vehicle to permit ascertaining of course and position in the absence of acoustic positioning signals.

BRIEF DESCRIPTION OF THE DRAWINGS

These and other features of the subject invention will be better understood in connection with a Detailed Description, in conjunction with the Drawings, of which.

DETAILED DESCRIPTION

Figure 1:
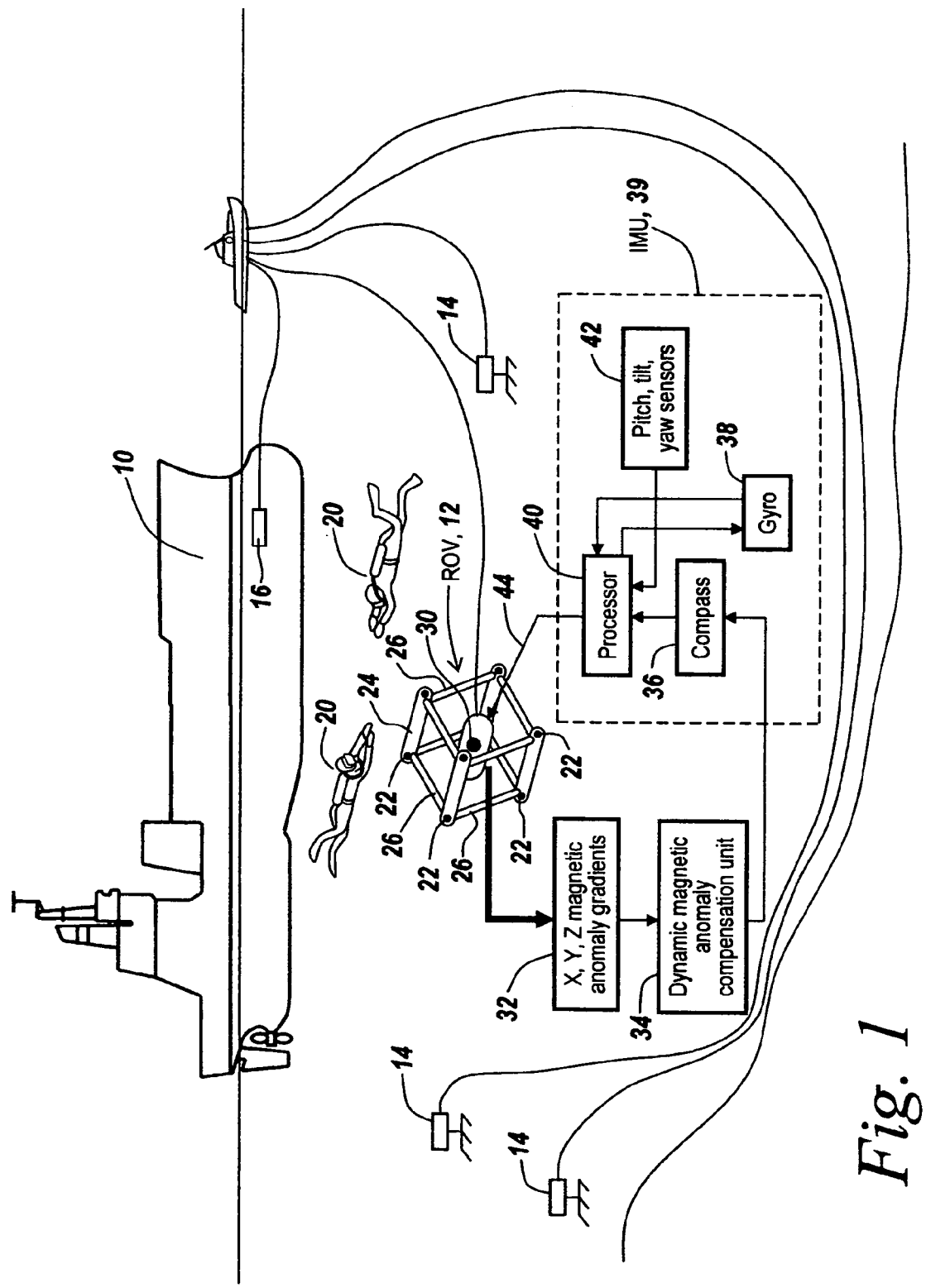
FIG. 1 is a diagrammatic illustration of the subject system involving a remotely operated vehicle in the form of a surveying robot adjacent a ship hull in which the remotely operated vehicle has pontoons arranged in a parallelopiped configuration, with each of the corners of the parallelopiped provided with three-axis magnetometers, the outputs of which are processed to generate magnetic anomaly gradients in three orthogonal directions, the gradients being used to provide dynamic magnetic anomaly compensation for either a gyroscope or an electronic compass in an inertial management unit that directs the propulsion system for the remotely operated vehicle.

Referring now to FIG. 1, when it is desirable to do an in-water survey of a ship hull 10, in accordance with the aforementioned patent application, it is desirable to provide a survey robot or remotely operated vehicle ROV 12 to fly around the ship hull and to measure the thickness of the ship hull at a wide variety of locations using acoustic techniques.

The location of ROV 12 is initially determined through a network of transceivers 14 that are tethered to the sea floor and which, in combination with a pinger hydrophone 16 as described in the above-mentioned patent, provide for the instantaneous position of the ROV with respect to the ship's hull.

The exact position of the ROV relative to the ship's hull is important to be able to do a survey in which the survey points are no more than one centimeter apart. It is the purpose of the surveying ROV to be able to scan the entire hull and make thickness measurements relative to the hull at points whose location accuracy is determinable in centimeters.

While the system described in the aforementioned patent application works well when transceivers 14 have a direct acoustic line of sight between themselves and pinger 16, when this line of sight becomes occluded either by divers 20 in the water around the hull or due to the blocking of the signals from the transceivers by the ROV itself, then in order to get the precise measurement noted above it is important that ROV 12 carry an inertial guidance system that is called into play when signals from the network can no longer be relied upon.

Whatever the source of the outage of the ROV location signals is, in order to provide for the above-mentioned high accuracy survey, it is necessary to be able to correct the output of the inertial management unit that provides inertial guidance for the ROV in terms of errors induced by drift or precession of the laser gyros used in such units.

Moreover, such inertial management units also require the output of an electronic compass whose readings are affected by close-in ferromagnetic materials or the fields generated by electric motors. Thus, even with rate gyros or the use of electronic compasses, inertial management units suffer from the magnetic anomalies generated by ferromagnetic materials such as ship hull steel as well as magnetic fields generated by the thrusters used for the remotely operated vehicle as well as electric motors that may be used to propel divers or run equipment within the ship being surveyed.

As will be described, ROV 12 is provided with three-axis magnetometers 22 at the corners of a parallelopiped, which in one embodiment refers to the ends of pontoons 24 interconnected with struts 26 that form a cubic cage about an acoustic sensing and control unit 30 mounted in the center of the cage.

It will be appreciated that in one embodiment ROV 12 is neutrally buoyant and therefore can assume any attitude in the water.

As will be described, the three-axis magnetometers provide outputs corresponding to the magnetic field at each of the magnetometers along three orthogonal axes, here labeled x, y and z, with a processing unit 32 comparing the outputs from pairs of the magnetometers to generate signals that correspond to the magnetic anomaly gradient vector in the three orthogonal positions shown.

Knowing the magnetic anomaly gradients in three orthogonal directions, a dynamic magnetic anomaly compensation unit 34 generates an output applied to electronic compass 36 and a gyroscope 38 within an inertial management unit 39 to either re-cage the gyroscope to a previous known position or to compensate the electronic compass for deviations due to the magnetic anomalies generated locally. Thus, the outputs of compass 36 and gyro 38 are compensated and applied to a processing unit 40 along with pitch/tilt/yaw sensors 42. Control signals from processor 40 are coupled to line 44 to control the ROV, with the exact position and direction of ROV 12 being known regardless of outages. This permits the ROV's thrusters to be adjusted to move ROV 12 to exact positions relative to hull 10. In so doing, the detection of magnetic anomaly gradients from pairs of three-axis magnetometers permits compensation of compass 36 and re-caging of gyro 38 or adjustment of the heading outputted by the gyro. In one embodiment, the heading output of the compass is adjusted to cancel out the effect of any magnetic anomaly. The output of compass 36 is then coupled to processing unit 40 to provide either a heading correction for the output of gyro 38, or to provide signals for the re-caging of the gyro. Either way, processing unit 40 is provided with corrected inputs to be able to ascertain vehicle position and thus generate signals to control vehicle propulsion.

Figure 2:
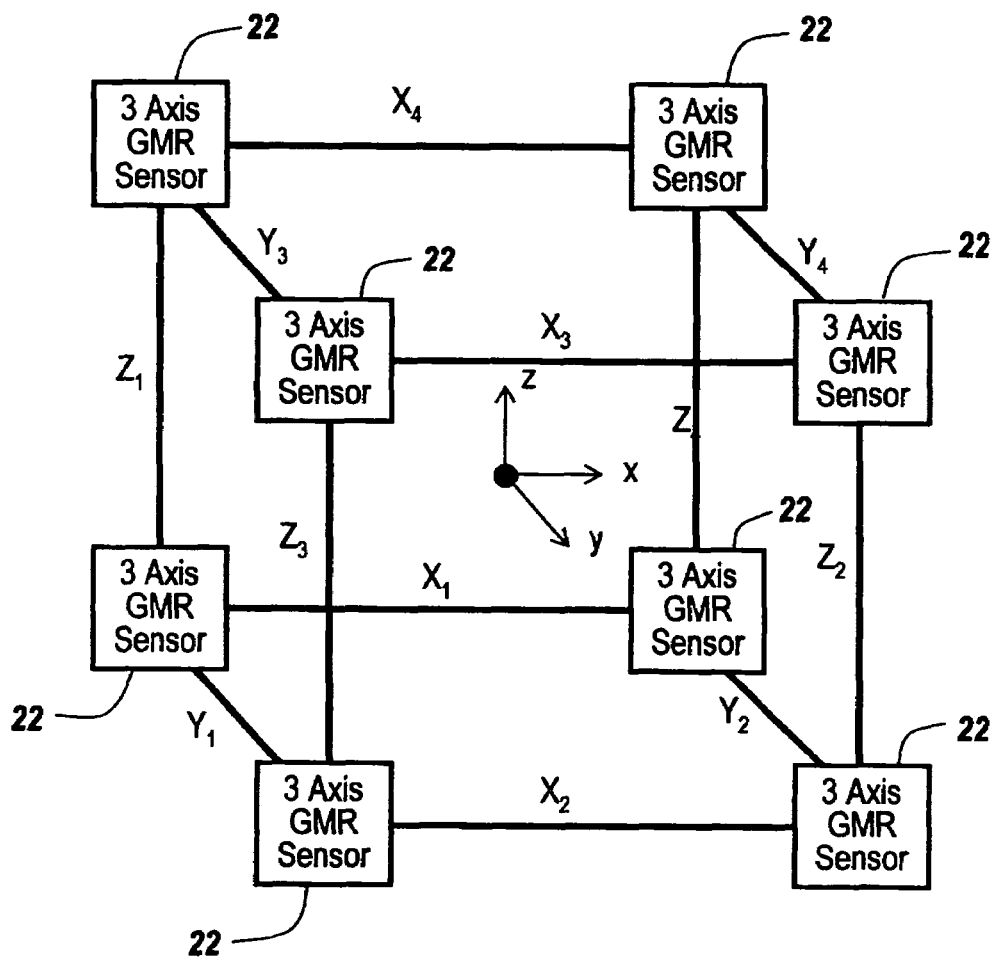
FIG. 2 is a diagrammatic illustration of the use of three-axis GMR sensors at the corners of a parallelopiped indicating the alignment of the three axes of one of the sensors with the corresponding axes of the other of the sensors.

Referring to FIG. 2, magnetometers of FIG. 1 may be provided by three-axis GMR sensors 22 that have their respective axes parallel to one another such that, when oriented as shown, provide three-axis outputs along the x, y and z directions.

Figure 3:
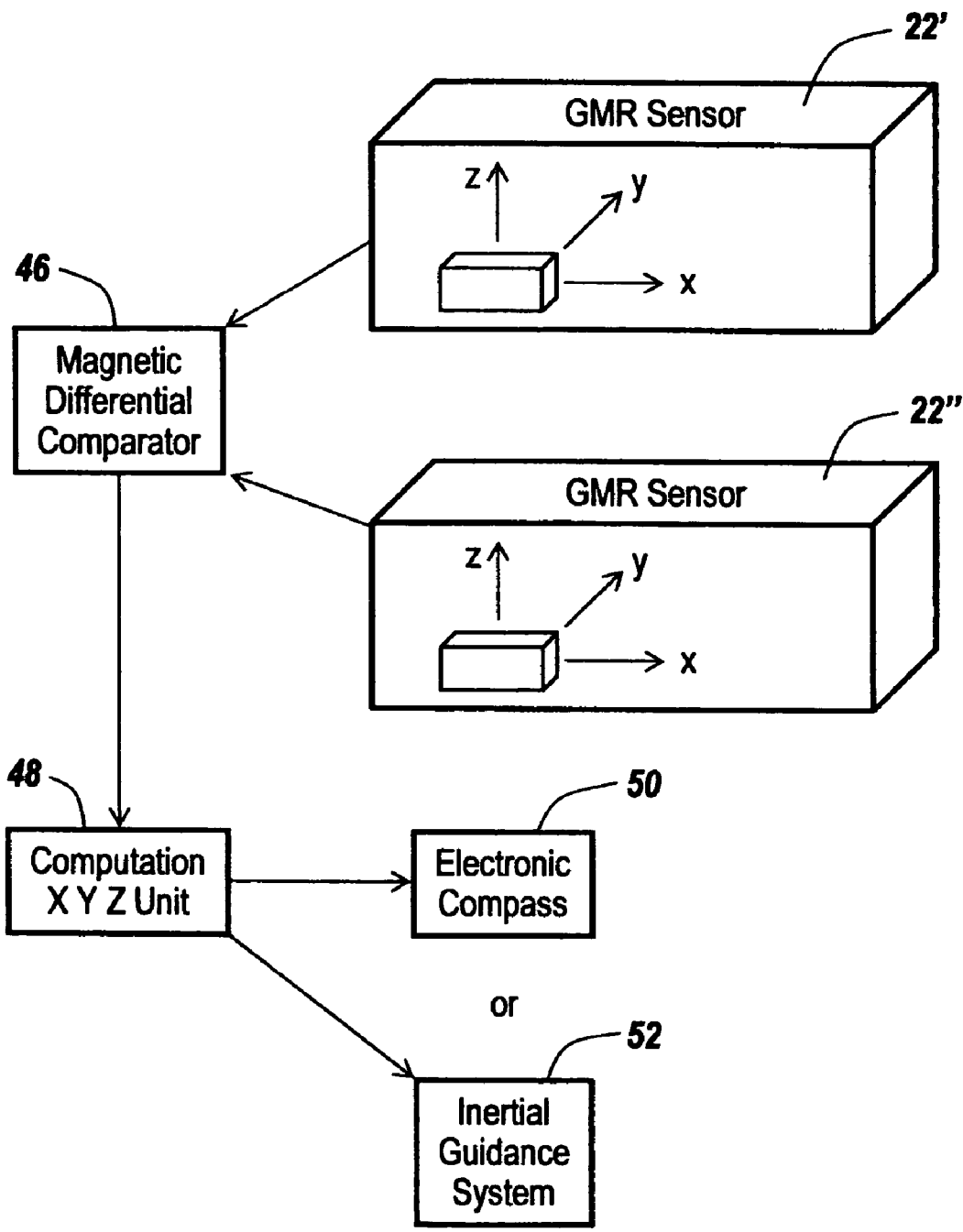
FIG. 3 is a diagrammatic illustration of the use of the three-axis outputs from a pair of sensors to provide a magnetic differential comparison between the outputs coupled to a computation unit for providing corrections or compensations in three orthogonal directions applied to either an electronic compass or an inertial guidance system; and, FIG. 4 is a block diagram of a robotic control system directed by an inertial management unit that has an internal gyro, pitch/tilt/yaw sensors and an electronic compass, with the electronic compass and/or gyro compensated by a differential comparison of pairs of outputs from the magnetometers of FIG. 1.

Referring now to FIG. 3, a pair of three-axis GMR sensors 22' and 22" each providing magnetic measurements along axes x, y and z are coupled to a magnetic differential comparator 46, which provides outputs equal to the differences between the measurement in the x, y and z directions from the two sensors. The output of the magnetic differential comparator is a magnetic anomaly gradient vector coupled to an x, y, z computation unit 48 that computes from the magnetic anomaly gradient in the x, y and z direction compensation factors that are in turn coupled to an electronic compass 50 or an inertial guidance system 52 to correct the electronic compass for local magnetic anomalies due to ferromagnetic masses near the compass and/or to correct the inertial guidance system gyroscope based on the measured magnetic anomaly gradients.

Figure 4:
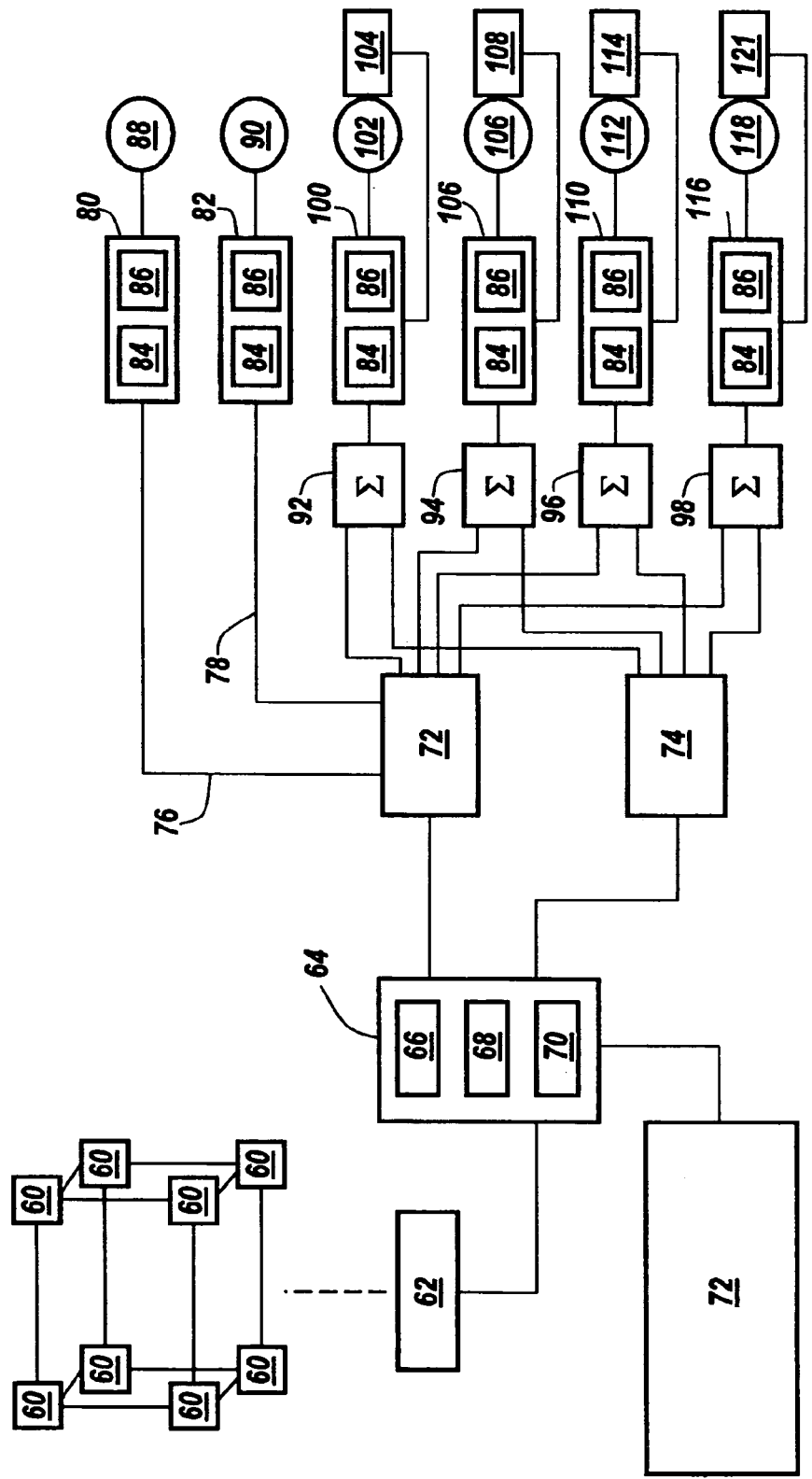

Referring now to FIG. 4, in one embodiment an array of GMR three-axis sensors 60 is read out to a magnetic differential comparator and computation x, y, z unit 62, which is coupled to an inertial management unit 64 that includes a gyroscope 66, pitch, tilt and yaw sensors 68 and an electronic compass 70. Signals from a surface control interface 72 that provide for the location of the ROV based upon the aforementioned acoustic network is supplied to the inertial management unit.

The output of inertial management unit 64 is applied to an attitude controller 72 and a direction and speed controller 74. Outputs along lines 76 and 78 from attitude controller 72 are applied respectively to a unit 80 for articulating the robot in the x direction and an articulator 82 for articulating the robot in the y direction. Each of these articulators is provided with a motion controller 84 and an amplifier 86 applied respectively to a linear actuator 88 and a rotary actuator 90 for the translation and rotation of thrusters.

The outputs from attitude controller 72 and direction and speed controller 74 are summed respectively at 92, 94, 96 and 98.

The output of summation unit 92 is applied to a port side bow thruster control unit 100 supplied with motion controller 84 and amplifier 86. The output of this unit controls the port side bow thruster 102, with a thrust sensor 104 coupled back to unit 100 for feedback purposes.

Likewise, the output of summation unit 94 is coupled to a starboard thruster control unit 106, likewise having motion controller 84 and amplifier 86 that is coupled to a thruster 106, which is the starboard bow thruster. A thrust sensor 108 provides a feedback look to unit 106.

The output of summation unit 96 is applied to a port stern thruster control unit 110, likewise provided with motion controller 84 and amplifier 86, with the output of amplifier 86 being applied to a port stern thruster 112. A thrust sensor 114 is coupled for feedback purposes back to control unit 110.

The output of summation unit 98 is coupled to a starboard stern thruster control unit 116, likewise having motion controller 84 and amplifier 86, which is coupled to a starboard stern thruster 118. A thrust sensor 120 is coupled back to control unit 116 for feedback purposes as illustrated.

What can be seen is that bow and stern thrusters can be adequately controlled to control the attitude and position of the remotely operated vehicle to be able to control the position of the vehicle at times when the surface control interface is down or inoperative. This means that the remotely operated vehicle can rely on its inertial management unit to track its positional progress, with the gyroscope and electronic compass used by the inertial management unit corrected on the fly with compensation signals derived from a magnetic differential comparison of the outputs of the eight three-axis magnetometers.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A system for dynamically compensating for magnetic anomalies due to the proximity of ferromagnetic objects or electric motors, comprising:

a parallelopiped;

three-axis magnetometers each having three orthogonal axes, each of said magnetometers measuring magnetic field thereat and supplying a corresponding output, located at selected corners of said parallelopiped, said magnetometers having their three orthogonal axes aligned with the three orthogonal axes of the other magnetometers;

a processor coupled to the outputs of said magnetometers to derive a magnetic anomaly gradient vector in terms of a difference in sensed magnetic field due to the presence of an anomaly; and, an instrument for which heading is an output including a compass, said magnetic anomaly gradient vector coupled to said compass to compensate said compass for said magnetic anomalies.

2. The system of claim 1, wherein the number of said magnetometers is four.

3. The system of claim 1, wherein the number of said magnetometers is eight.

4. The system of claim 1, wherein said processor includes means for deriving the difference along a given axis between the outputs of pairs of said magnetometers.

5. The system of claim 1, wherein said magnetometers include GMR sensors.

6. The system of claim 1, wherein said instrument for which heading is an output includes a gyroscope, and wherein said heading output is corrected in accordance with the output of said compensated compass.

7. A system for dynamically compensating for magnetic anomalies due to the proximity of ferromagnetic objects or electric motors, comprising:

a parallelopiped;

three-axis magnetometers each having three orthogonal axes, said magnetometers being located at selected corners of said parallelopiped, each of said magnetometers having the three orthogonal axes thereof aligned with the three orthogonal axes of the other magnetometers;

an instrument for which heading is an output, said instrument including a compass and a gyroscope; and, a processor coupled to the outputs of said magnetometers to derive a magnetic anomaly gradient vector in terms of the difference in sensed magnetic field due to the presence of an anomaly, said magnetic anomaly gradient vector used to compensate for heading errors from said instrument by compensating said compass or said gyroscope.

8. The system of claim 7, wherein said gyroscope is resettable by the output of said compass to initialize the heading output therefrom, whereby said magnetic anomaly gradient vector is used in resetting said gyroscope.

9. A method for assuring positional control of a remotely operated vehicle adapted to be maneuvered around the hull of a vessel when acoustic network positioning signals are unavailable, comprising the steps of:

providing the remotely operated vehicle with an inertial management unit having a compass, a gyroscope and a positional output for ascertaining the position of the remotely operated vehicle and for controlling the position thereof;

establishing the position of the remotely operated vehicle utilizing the acoustic network;

establishing the position of the remotely operated vehicle utilizing the inertial management unit when the position associated with the acoustic network is unreliable;

detecting any magnetic anomaly gradient vector at the remotely operated vehicle; and, compensating the positional output of the inertial management unit utilizing the detected magnetic anomaly gradient vector.

10. The method of claim 9, wherein the compass has an output and wherein the magnetic anomaly gradient vector is utilized to compensate the output of the compass in the inertial management unit.

11. The method of claim 9, wherein the magnetic anomaly gradient vector is used to compensate the gyroscope.

12. The method of claim 10, wherein the output of the compensated compass is used to compensate the gyroscope.

13. The method of claim 9, wherein the detecting step includes the steps of locating a number of three-axis magnetometers at selected corners of a parallelopiped such that the three axes of the magnetometers are aligned with respective axes of the other magnetometers;

differencing the outputs of selected pairs of the magnetometers so as to generate a magnetic gradient along a predetermined one of the axes; and, combining the results of the differences to generate the magnetic anomaly gradient vector.

14. For use in a neutrally buoyant remotely operated vehicle to permit ascertaining position of said vehicle in the absence of surface control signals, said vehicle having an inertial management unit including a compass, apparatus for compensating the compass used by the inertial management unit for said vehicle for magnetic anomalies in the vicinity of said compass, comprising:

an array of three-axis magnetometers, each having three orthogonal axes, said magnetometers being disposed at selected corners of a parallelopiped, said magnetometers having their axes co-aligned; and, a processor for deriving from pairs of outputs of said magnetometers a magnetic anomaly gradient at said compass in terms of the difference in sensed magnetic field due to the presence of an anomaly and for generating a deviation correction for said compass responsive to said magnetic anomaly gradient, thus to cancel out the effect of said magnetic anomaly gradient on said compass, whereby said compass may be used by said inertial management unit in the absence of surface control signals regardless of local magnetic anomalies.

15. The apparatus of claim 14, wherein said inertial management unit includes a gyroscope having a heading output and wherein the heading output of said gyroscope is corrected in accordance with the corrected output of said compass.

16. The apparatus of claim 14, wherein said inertial management unit includes a gyroscope and wherein said magnetic anomaly gradient is used to reset said gyroscope.

17. The apparatus of claim 14, wherein said magnetometers include GMR sensors.

* * * * *